United States Patent
Yan et al.

(10) Patent No.: US 9,876,193 B2
(45) Date of Patent: Jan. 23, 2018

(54) THIN-FILM DEVICE

(71) Applicant: Industrial Technology Research Institute, Hsinchu (TW)

(72) Inventors: Jing-Yi Yan, Hsinchu County (TW); Chen-Yu Chiang, Taoyuan County (TW); Wen-Tung Wang, Hsinchu County (TW); Bo-Cheng Kung, Tainan (TW); Hung-Chien Lin, Tainan (TW); Liang-Hsiang Chen, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 657 days.

(21) Appl. No.: 14/055,845

(22) Filed: Oct. 16, 2013

(65) Prior Publication Data
US 2014/0349091 A1    Nov. 27, 2014

(30) Foreign Application Priority Data
May 21, 2013    (TW) .............................. 102117838 A

(51) Int. Cl.
*H01L 51/52*    (2006.01)
*H01L 51/00*    (2006.01)

(52) U.S. Cl.
CPC ........ *H01L 51/5256* (2013.01); *H01L 51/003* (2013.01); *H01L 51/0097* (2013.01); *H01L 2251/55* (2013.01); *Y02E 10/549* (2013.01); *Y10T 428/24942* (2015.01)

(58) Field of Classification Search
CPC ............. H01L 51/5256; H01L 51/0097; H01L 51/003; H01L 2251/55; Y02E 10/549; Y10T 428/24942

USPC ......................................................... 428/212
See application file for complete search history.

(56) References Cited

U.S. PATENT DOCUMENTS

| | | | |
|---|---|---|---|
| 8,067,802 B2 | 11/2011 | Dekker et al. | |
| 8,182,633 B2 | 5/2012 | Yoon et al. | |
| 8,222,062 B2 | 7/2012 | Liao et al. | |
| 2010/0167031 A1* | 7/2010 | Leu | B32B 27/32 428/212 |
| 2011/0052836 A1 | 3/2011 | Kim et al. | |
| 2011/0223697 A1 | 9/2011 | Yong-Hwan et al. | |

(Continued)

FOREIGN PATENT DOCUMENTS

| TW | I368801 | 1/2004 |
|---|---|---|
| TW | 201025515 A1 | 7/2010 |

(Continued)

OTHER PUBLICATIONS

RefractiveIndex.info, Optical constants of Si3N4 (Silicon nitride), May 2015, https://web.archive.org/web/20150521003332/http://refractiveindex.info/?shelf=main&book=Si3N4&page=Philipp.*

(Continued)

*Primary Examiner* — Brian Handville

(57) ABSTRACT

A thin-film device may include a carrier, a release layer, a stacking structure, and a flexible substrate. The release layer may be overlaid on the carrier, and the stacking structure is overlaid on the release layer. The stacking structure may include a first protective layer and a second protective layer, wherein the refractive index of the first protective layer exceeds that of the second protective layer. The flexible substrate may be overlaid on the release layer.

21 Claims, 3 Drawing Sheets

(56) References Cited

U.S. PATENT DOCUMENTS

2011/0227066 A1* 9/2011 Umezaki ............ H01L 27/1255
257/43
2012/0038032 A1 2/2012 Dekker et al.

FOREIGN PATENT DOCUMENTS

TW 201237828 A1 9/2012
TW 201304644 A1 1/2013

OTHER PUBLICATIONS

RefractiveIndex.info, Optical constants of SiO2 (Silicon dioxide, Silica, Quartz), Jan. 2015, https://web.archive.org/web/20150116220424/http://refractiveindex.info/?shelf=main&book=SiO2&page=Malitson.*

Sundaram, K.B., et al., Silicon Nitride and Silicon Dioxide Thin Insulating Films, 2001, The Electrochemical Society, Inc., pp. 191-192.*

Para Tech, Parylene Properties, Jul. 2015, https://web.archive.org/web/20150724050517/http://www.parylene.com/pdfs/PTC-Parylene_Properties_Chart.pdf.*

Machine Translation of KR 10-2012-0103388. 2012.*

Springer Materials, Si2N2O refractive index, 2017, obtained from http://materials.springer.com/isp/physical-property/docs/ppp_092228.*

Taiwan Patent Office, Office Action, Patent Application Serial No. 102117838, dated Aug. 13, 2015, Taiwan.

Francois Templier et al., "Fabrication of high performance low temperature poly-silicon backplanes on metal foil for flexible active-matrix organic light emission diode displays," Thin Solid Films, Jul. 2007, pp. 7428-7432, vol. 515, Issue 19, Elsevier, US.

Kalluri R. Sarma et al., "Flexible Active Matrix Organic Light Emitting Diode (AM OLED) Displays," The 9th Asian Symposium on Information Display, Oct. 2006, New Delhi, pp. 337-342, Proc. of ASID '06, US.

Hung-Wen Suac et al., "High refractive index polyimide—nanocrystalline-titania hybrid optical materials," Journal of Materials Chemistry, Jan. 2008, pp. 1139-1145, vol. 18, The Royal Society of Chemistry, US.

A. Percora et al., "Low-temperature polysilicon thin film transistors on polyimide substrates for electronics on plastic," Solid-State Electronics, Mar. 2008, pp. 348-352, vol. 52, Issue 3, Elsevier, US.

Kazushige Takechi et al., "Transfer Processes for Thermally Stable Large-Size TFT Flexible Substrates," IEEE Transactions on Semiconductor Manufacturing, Feb. 2007, pp. 20-25, vol. 20, No. 1, IEEE, US.

T, Sameshima et al., "Pulsed laser induced melting followed by quenching of silicon films," J. Appl. Phys., Dec. 1993, pp. 6592-6598, vol. 74, Issue 11, IEEE, US.

* cited by examiner

THIN-FILM DEVICE

CROSS-REFERENCE TO RELATED APPLICATIONS

The present application is based on, and claims priority from, Taiwan Application Serial Number 102117838, filed on May 21, 2013, the disclosure of which is hereby incorporated by reference herein in its entirety.

TECHNICAL FIELD

The technical field relates to thin-film devices.

BACKGROUND

A conventional manufacturing method for a flexible display panel includes separating a flexible substrate from a hardness carrier. When the flexible substrate is separated from the hardness carrier, a high-energy light beam is emitted to the hardness carrier to degrade the release layer. The flexible substrate may easily be separated from the hardness carrier. However, a part of the high-energy light beam may pass through the release layer and damage the flexible substrate, decreasing the yield rate of the product.

In some thin-film or thin-film transistor (TFT) processes, a high-energy light beam is emitted on the thin-film layer. However, a part of the high-energy light beam may pass through the thin-film layer to the flexible substrate and do damage thereto. Thus, the following processes are influenced, and the yield rate of the product may be decreased.

SUMMARY

The present disclosure may decrease damage to the flexible substrate caused by high-energy light beams, or protect the release layer during the aforementioned processes.

The present disclosure may provide a thin-film device including a carrier, a release layer, a stacking structure, and a flexible substrate. The release layer may be overlaid on the carrier, and the stacking structure is overlaid on the release layer. The stacking structure may include a first protective layer and a second protective layer in contact with the first protective layer, wherein the refractive index of the first protective layer is different from the refractive index of the second protective layer. The flexible substrate may be overlaid on the stacking structure.

The present disclosure may provide a thin-film device comprising a carrier, a release layer, a plurality of stacking structures overlaid on each other, and a flexible substrate. The release layer is overlaid on the carrier, and the stacking structures are overlaid on the release layer. Each of the stacking structures may include a first protective layer and a second protective layer contact with the first protective layer, wherein the refractive index of the first protective layer is different from the refractive index of the second protective layer. The flexible substrate is overlaid on the stacking structures. The first protective layers and the second protective layer may be alternately overlaid on each other.

The stacking structure of the present disclosure may decrease the energy of the light beam passing through the flexible substrate, or it protects the release layer during the aforementioned processes, thus improving the yield rate of the product.

BRIEF DESCRIPTION OF THE DRAWINGS

The present disclosure can be more fully understood by reading the detailed description and examples with references made to the accompanying drawings, wherein.

DETAILED DESCRIPTION

Figure 2:
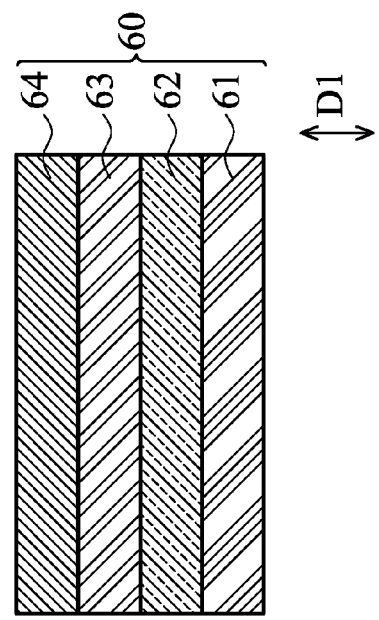
FIG. 2 is a cross-sectional view of the electronic device according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

The following disclosure provides many different embodiments, or examples, for implementing different features of the present disclosure. Specific examples of components and arrangements are described below to simplify the present disclosure. For example, the formation of a first feature overlaid or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
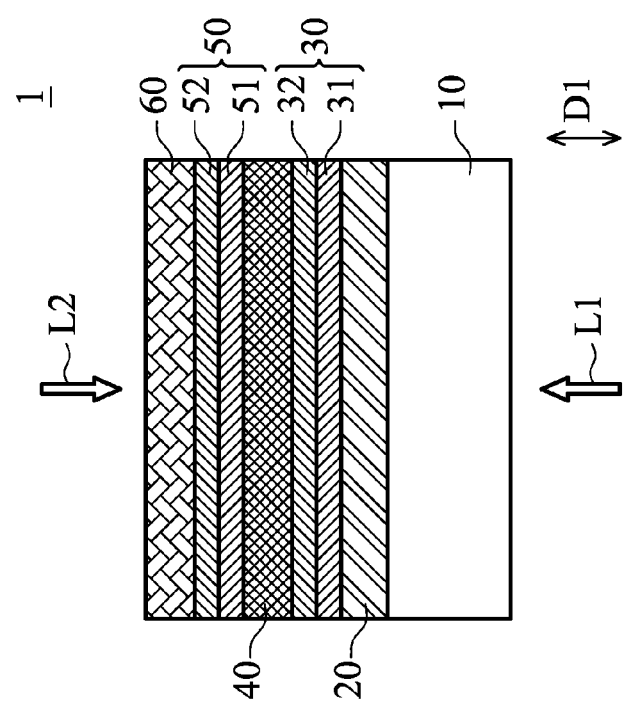
FIG. 1 is a cross-sectional view of a thin-film device according a first embodiment of the present disclosure.

FIG. 1 is a cross-sectional view of a thin-film device 1 according the first embodiment of the present disclosure. The thin-film device 1 includes a carrier 10, a release layer (or a sacrificial layer) 20, a first stacking structure 30, a flexible substrate 40, a second stacking structure 50, and an electronic device 60. In the embodiment, the carrier 10, the release layer 20, the first stacking structure 30, the flexible substrate 40, the second stacking structure 50, and the electronic device 60 are overlaid in sequence along a stacking direction D1. In another embodiment, the overlaid sequence is not limited thereto.

The carrier 10 may be a hardness carrier, such as a glass or a wafer. The release layer 20 may include organic or inorganic materials, such as hydrogen-containing silicon oxide, silicon nitride or silicon film. The release layer 20 is overlaid on the carrier 10. When the release layer 20 is exposed to a light beam L1, the adhesion force between the flexible substrate 40 and carrier 10 is decreased, and thus, the carrier 10 may be separated from the thin-film device 1.

The first stacking structure 30 is overlaid on the release layer 20, and it may be a flexible stacking structure. The first stacking structure 30 may be a transparent material, and it can reflect a light beam with a specific wavelength, such as a light beam with a wavelength of 308 nm. The first stacking structure 30 includes at least one first protective layer 31 and at least one second protective layer 32. Both the first protective layer 31 and the second protective layer 32 may be flexible layers, and the first protective layer 31 is in contact with the second protective layer 32. The number of protective layers is not limited thereto. In the embodiment, the first protective layer 31 is overlaid on the release layer 20, and the second protective layer 32 is overlaid on the first protective layer 31.

The ratio of the refractive index of the first protective layer 31 to the refractive index of the second protective layer 32 is greater than 1.05. The absolute value of the refractive index of the first protective layer 31 minus the refractive index of the release layer 20 is greater than the absolute value of the refractive index of the second protective layer 32 minus the refractive index of the release layer 20. The thickness of the first protective layer 31 and of the second protective layer 32 may be from 20 nm to 350 nm, and the ratio of the thickness of the first protective layer 31 to that of the second protective layer 32 may be from 0.1 to 5.

In general, the ratio is greater, and the reflection of the light beam L1 by the stacking structure is greater. Thus, the thickness and the refractive index of the first protective layer 31 and those of the second protective layer 32 may be adjusted according to the wavelength of the light beam to give the stacking structure a better reflectivity. In the embodiment, the refractive index of the first protective layer 31 is about 2.03, and the refractive index of the second protective layer 32 is about 1.49. The ratio of the refractive index of the first protective layer 31 to the refractive index of the second protective layer 32 is about 1.36. The thickness of the first protective layer 31 is about 45 nm, and the thickness of the second protective layer 32 is about 45 nm.

In general, if a protective layer has a greater thickness, the protective layer has a better reflectivity to a light beam with a longer wavelength. For example, a protective layer 35 nm thick has a better reflectivity to reflecting light beams with a wavelength of 250 nm, a protective layer 44 nm thick has a better reflectivity to light beams with a wavelength of 308 nm, and a protective layer 142 nm thick has a better reflectivity to light beams with a wavelength of 1000 nm.

In addition, in the direction in which the light beam L1 is being transmitted, the refractive index of the protective layer (such as the first protective layer 31 in FIG. 1) that the light beam L1 passes through first is greater, and the reflectivity of the protective layer to the light beam L1 is better. Thus, in the embodiment, the refractive index of the first protective layer 31 is greater than the refractive index of the second protective layer 32, but it is not be limited thereto.

The first protective layer 31 includes silicon nitride, silicon oxide, titanium oxide, niobium oxide, or combinations thereof. In the embodiment, the first protective layer 31 is made from $Si_3N_4$. The second protective layer 32 includes silicon nitride, silicon nitride, titanium oxide, or niobium oxide. In the embodiment, the second protective layer 32 is made from $SiO_2$. The material of the protective layers may not be limited thereto when the refractive index of the material of the first protective layer 31 is not equal to (i.e. is greater than or less than) the refractive index of the material of the second protective layer 32.

The flexible substrate 40 includes polymer. In the embodiment, the flexible substrate 40 is overlaid on the first stacking structure 30. In other words, the first stacking structure 30 is located between the flexible substrate 40 and the release layer 20. The second stacking structure 50 is overlaid on the flexible substrate 40, and may be a flexible stacking structure. The second stacking structure 50 may be a transparent material, and reflects a light beam with a specific wavelength, such as a wavelength of 308 nm.

The second stacking structure 50 includes a third protective layer 51 and a fourth protective layer 52. Since the characteristics of the third protective layer 51 and the fourth protective layer 52 are similar to the characteristics of the first protective layer 31 and the second protective layer 32, a further detailed description will be omitted for brevity. In an embodiment, the refractive index, material, and thickness of the first protective layer 31 and those of the third protective layer 51 are the same, and the refractive index, material, and thickness of the second protective layer 32 and of the fourth protective layer 52 are the same.

The electronic device 60 includes electronic components such as resistors, capacitors, and/or inductors. The electronic device 60 may be a flexible display panel or a flexible semiconductor component, and the flexible display panel may be a flexible organic light-emitting diode (OLED) panel, or a liquid-crystal panel. The electronic device 60 is overlaid on the second stacking structure 50.

In another embodiment, the structure as shown in FIG. 1 may exclude the first stacking structure 30 or the second stacking structure 50. For example, in an embodiment, the second stacking structure 50 is excluded, and the electronic device 60 is in contact with the flexible substrate 40.

FIG. 2 is a cross-sectional view of the electronic device 60 according to the first embodiment of the present disclosure. In the embodiment, the electronic device 60 may be a flexible OLED display panel including a buffer layer 61, a thin-film transistor layer (TFT) 62, an organic light-emitting diode (OLED) layer 63, and a protective layer 64. The buffer layer 61, the thin-film transistor layer 62, the organic light-emitting diode layer 63, and the protective layer 64 may be overlaid in sequence along the stacking direction D1.

The thin-film transistor layer 62 may includes a plurality of transistors (not shown), and the organic light-emitting diode layer 63 may include a plurality of organic light-emitting diodes (not shown). In another embodiment, the electronic device 60 may be a flexible semiconductor component, and the thin-film transistor layer 62 may be a metal oxide semiconductor (MOS) layer. In another embodiment, the electronic device 60 may be a liquid-crystal panel, and the organic light-emitting diode layer 63 may be a liquid-crystal layer. However, since the electronic device 60 is a conventional art, a further detailed description will be omitted for brevity.

In another embodiment, the electronic device 60 may be excluded, or a part of the components in the electronic device 60 is excluded. The flexible substrate 40 may be a flexible display panel or a flexible semiconductor component, and the structure of the flexible substrate 40 may be similar to the structure of the electronic device 60. The designs of the flexible substrate 40 and the electronic device 60 may refer to the described electronic device 60.

As shown in FIG. 1, when a user wants to remove the carrier 10 from the thin-film device 1, the light beam L1 is emitted to the carrier 10 along the stacking direction D1 and passes through the thin-film device 1. The light beam L1 may be a high-energy light beam, such as a laser or an ultraviolet light. In the embodiment, the light beam L1 may be laser, and the wavelength of the light beam L1 is from 200 nm to 750 nm. In this case, the wavelength is 308 nm.

When the light beam L1 passes through the release layer 20, the release layer 20 undergoes a chemical change, such as gasification or decomposition, due to the light beam L1. Thus, the adhesion force between the flexible substrate 40 (the first stacking structure 30) and the carrier 10 is decreased, and the carrier 10 is removable to the flexible substrate 40 (the first stacking structure 30).

After the light beam L1 passes through the release layer 20, a part of the light beam L1 passes through the first stacking structure 30. When the light beam L1 passes through the first stacking structure 30, the light beam L1 is reflected, totally reflected, and/or refracted to the first protective layer 31 and the second protective layer 32. Thus, a part of the light beam L1 is blocked from emitting to the flexible substrate 40. In the embodiment, the reflectivity of the first stacking structure 30 to the light beam L1 is at least 50%, and thus, the degradation and the damage of the flexible substrate 40 due to the high-energy light beam L1 is deceased, improving the yield rate of the product.

After the light beam L1 passes through the first stacking structure 30, a part of the light beam L1 passes through the second stacking structure 50. Similarly, when the light beam L1 passes through the second stacking structure 50, the light beam L1 is reflected, totally reflected, or refracted on the third protective layer 51 and the fourth protective layer 52. Thus, a part of the light beam L1 is blocked from being emitted to the electronic device 60.

In the embodiment, the reflectivity of the second stacking structure 50 to the light beam L1 is at least 50%, and the energy of the light beam L1 may be further decreased. Thus, some important components, such as the transistors and the organic light-emitting diodes, in the electronic device 60 are protected from the light beam with high energy, and the yield rate of the product is improved.

During manufacture of the thin-film transistor layer 62, a light beam L2 with high energy is emitted onto the electronic device 60 along the stacking direction D1. Since the reflectivity of the first stacking structure 30 or the second stacking structure 50 to the light beam L2 are at least 50%, the release layer 20 and the flexible substrate 40 are protected from the light beam L2 with high energy, and the yield rate of the product is improved.

In another embodiment, the first stacking structure 30 or the second stacking structure 50 is selective. The arrangement of the first stacking structure 30 and/or the second stacking structure 50 in the thin-film device 1 may be changed. Additional stacking structures may be included on the thin-film device 1.

Figure 3:
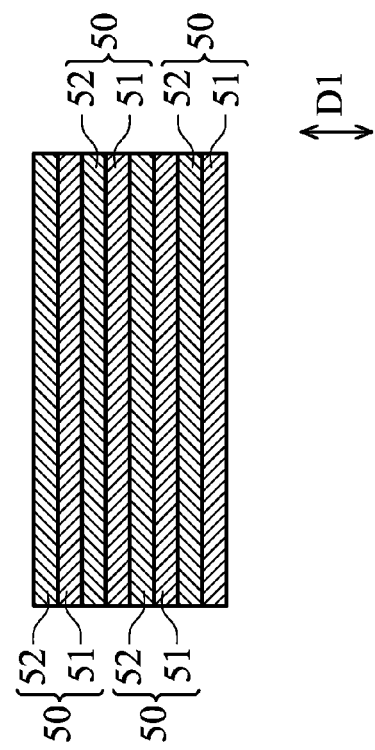
FIG. 3 is a cross-sectional view of a first stacking structure according to a second embodiment of the present disclosure.
Figure 4:
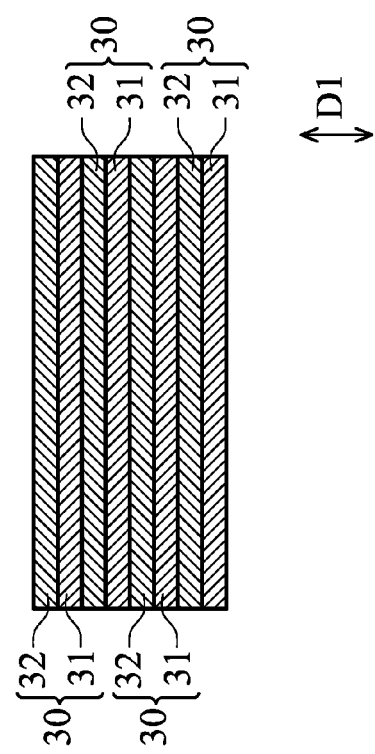
FIG. 4 is a cross-sectional view of a second stacking structure according to a second embodiment of the present disclosure.

FIG. 3 is a cross-sectional view of a first stacking structure 30 according to a second embodiment of the present disclosure. FIG. 4 is a cross-sectional view of a second stacking structure 50 according to a second embodiment of the present disclosure. In the embodiment, there are a plurality of first stacking structures 30 overlaid on each other and a plurality of second stacking structures 50 overlaid on each other. Namely, there are at least two stacking structures overlaid on each other on the release layer 20 along the stacking direction D1.

In the embodiment, there are four first stacking structures 30 overlaid on each other and four second stacking structures 50 overlaid on each other. The bottom first protective layer 31 is in contact with the release layer 20, and the top second protective layer 32 is in contact with the flexible substrate 40. The bottom third protective layer 51 is in contact with the flexible substrate 40, and the top fourth protective layer 52 is in contact with the electronic device 60. The first protective layers 31 and the second protective layers 32 of all of the first stacking structures 30 are alternately overlaid on each other, and the third protective layers 51 and the fourth protective layers 52 of all of the second stacking structure 50 are alternately overlaid on each other. Namely, the protective layers with a higher refractive index and the protective layers with a lower refractive index are alternately overlaid on each other.

In the embodiment, the reflectivity of the first stacking structures 30 or the second stacking structures 50 to the light beam L1 is from 85% to 95%. The degradation and the damage to the flexible substrate 40 and the electronic device 60 caused by the light beam L1 is decreased due to the first stacking structures 30 and the second stacking structures 50, and thus the yield rate of a product is improved.

In another embodiment, the reflectivity of the first stacking structures 30 or the two second stacking structures 50 to the light beam L1 is from 50% to 60%. In another embodiment, the reflectivity of three first stacking structures 30 or three second stacking structures 50 to the light beam L1 is from 70% to 80%. Thus, in general, when the first stacking structures 30 or the second stacking structures 50 are greater in number, the reflectivity of the first stacking structures 30 or the second stacking structures 50 to the light beam L1 is greater.

The numbers of the first stacking structures 30 and the second stacking structures 50 are not limited thereto. The number of first stacking structures 30 and second stacking structures 50 may be different. For example, the number of first stacking structures 30 is one, and the number of second stacking structures 50 is three.

Figure 6:
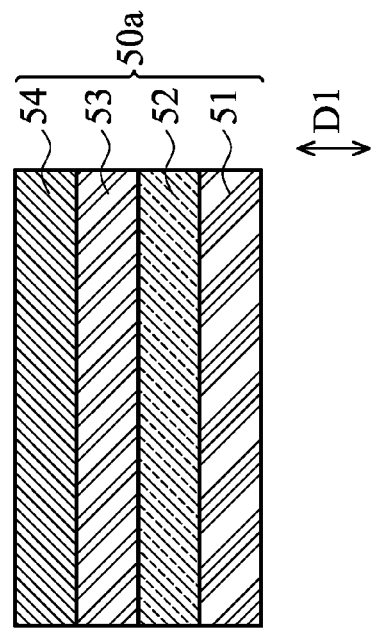
FIG. 6 is a cross-sectional view of the second stacking structure according to the third embodiment of the present disclosure.
Figure 5:
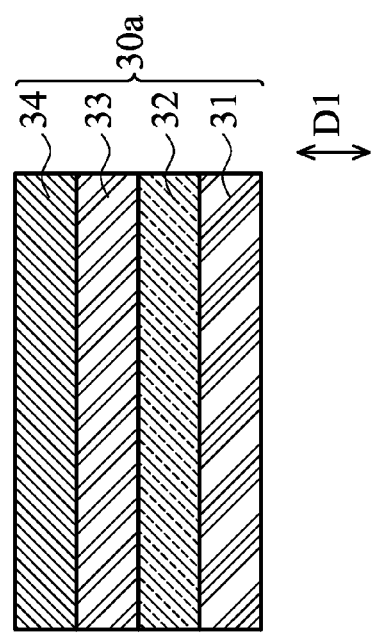
FIG. 5 is a cross-sectional view of the first stacking structure according to a third embodiment of the present disclosure.

FIG. 5 is a cross-sectional view of the first stacking structure 30a according to a third embodiment of the present disclosure. FIG. 6 is a cross-sectional view of the second stacking structure 50a according to the third embodiment of the present disclosure. The differences between the third embodiment and the second embodiment are described as follows. The first stacking structure 30a may further include a fifth protective layer 33 and a seventh protective layer 34. The design of the fifth protective layer 33 and the seventh protective layer 34 may be similar to that of the first protective layer 31 and the second protective layer 32, with regards to material and thickness. The thickness of each of the protective layers 31, 32, 33 and 34 may be different. In another case, at least two of the protective layers 31, 32, 33 and 34 may have the same thickness, such as the thickness of protective layers 31 and 33 are the same, and the thickness of protective layers 32 are 34 are the same.

The protective layers 31, 32, 33 and 34 may be arranged in sequence. Namely, the fifth protective layer 33 is overlaid on the second protective layer 32, and the seventh protective layer 34 is overlaid on the fifth protective layer 33, and the refractive index of two adjacent protective layers is different. For example, the refractive index of the fifth protective layer 33 and that of the second protective layer 32 are different; likewise the refractive index of the seventh protective layer 34 and the fifth protective layer 33. The protective layers 31, 32, 33 and 34 may include different materials, or at least two of protective layers 31, 32, 33 and 34 include the same material. In other words, protective layers 31, 32, 33 and 34 each have a different refractive index, or at least two of the protective layers 31, 32, 33 and 34 may be the same.

In the embodiment, the refractive index of the first protective layer 31 is greater than the refractive index of the second protective layer 32. The refractive index of the second protective layer 32 is smaller than the refractive index of the fifth protective layer 33. The refractive index of the fifth protective layer 33 is greater than the refractive index of the seventh protective layer 34. Thus, the protective layers having a greater refractive index and the protective layers having a lower refractive index are alternately overlaid on each other to provide a better refractive of to the light beam.

In another embodiment, the refractive index of the first protective layer 31 is smaller than the refractive index of the second protective layer 32. The refractive index of the second protective layer 32 is greater than the refractive index of the fifth protective layer 33. The refractive index of the fifth protective layer 33 is smaller than the refractive index of the seventh protective layer 34.

The second stacking structure 50a further includes a sixth protective layer 53 and an eighth protective layer 54. The characteristics, specifically in terms of refractive index, thickness and arrangement, of protective layers 51, 52, 53 and 54 are the same as the characteristics previously described for protective layers 31, 32, 33 and 34. The refractive index of two adjacent protective layers may be different. For example, the refractive index of the sixth protective layer 53 and that of the fourth protective layer 52 are different, and the refractive index of the eighth protective layer 54 and that of the sixth protective layer 53 are different.

In the embodiment, the refractive index of the third protective layer 51 is greater than the refractive index of the fourth protective layer 52. The refractive index of the fourth protective layer 52 is smaller than the refractive index of the sixth protective layer 53. The refractive index of the sixth protective layer 53 is greater than the refractive index of the eighth protective layer 54. Thus, the protective layers having a greater refractive index and the protective layers having a lower refractive index are alternately overlaid on each other.

As with the second embodiment illustrated in FIGS. 3 and 4, the third embodiment may include a plurality of first stacking structures 30a overlaid on each other, and a plurality of second stacking structures 50a overlaid on each other. A top fifth protective layer 33 or a top seventh protective layer 34 may be in contact with the flexible substrate 40, and a top sixth protective layer 53 or a top eighth protective layer 54 may be in contact with the electronic device 60. The first protective layers 31, the second protective layers 32, the fifth protective layers 33 and the seventh protective layers 34 are alternately overlaid on each other. The third protective layers 51, the fourth protective layers 52, the sixth protective layers 53 and the eighth protective layers 54 are alternately overlaid on each other.

The refractive index of protective layers is not limited thereto, since the protective layer having the greater refractive index and the protective layers having a lower refractive index are alternately overlaid on each other. In other words, the refractive index of one of the protective layers may be greater or smaller than two adjacent protective layers. The number of protective layers included in the first stacking structure 30a or the second stacking structure 50a is not limited thereto. The number of protective layers included in the first stacking structure 30a and second stacking structure 50a may be different. For example, the first stacking structure 30a includes two protective layers, and the second stacking structure 50a includes three protective layers.

The disclosed features may be combined, modified, or replaced in any suitable manner in one or more disclosed embodiments, but are not limited to any particular embodiments. For example, in the first embodiment, there are a plurality of first stacking structures 30 and 50. Each of the first stacking structures 30 includes four protective layers, and each of the second stacking structures 50 includes three protective layers.

The stacking structure of the present disclosure decreases the energy of the light beam passing through the flexible substrate, or protects the release layer during processing. Thus, the yield rate of the product is improved.

The terms, such as "first" or "second", in the specification are for the purpose of descriptive clarity only, but are not relative to the claims or meant to limit the scope of the claims. In addition, terms such as "first feature" and "second feature" do not indicate the same or different features.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A thin-film device, comprising:
   a carrier;
   a release layer overlaid on the carrier;
   a first stacking structure, overlaid on the release layer, comprising:
      a first protective layer;
      a second protective layer, in contact with the first protective layer, wherein a refractive index of the first protective layer is greater than a refractive index of the second protective layer; and
      a fifth protective layer, in contact with the second protective layer, wherein a refractive index of the fifth protective layer is greater than the refractive index of the second protective layer; and
   a flexible substrate overlaid on the first stacking structure, wherein the first protective layer is overlaid on the release layer, the second protective layer is overlaid on the first protective layer, the fifth protective layer is overlaid on the second protective layer, and an absolute value of the refractive index of the first protective layer minus a refractive index of the release layer is greater than an absolute value of the refractive index of the second protective layer minus the refractive index of the release layer, wherein a reflectivity of the first stacking structure to a light beam passing there through is at least 50%.

2. The thin-film device as claimed in claim 1, wherein a ratio of the refractive index of the first protective layer to the refractive index of the second protective layer is greater than 1.05.

3. The thin-film device as claimed in claim 1, wherein the first protective layer comprises silicon nitride, silicon oxide, titanium oxide, niobium oxide, or a combination thereof, and the second protective layer comprises silicon nitride, silicon oxide, titanium oxide, niobium oxide, or a combination thereof.

4. The thin-film device as claimed in claim 1, wherein a thickness of the first protective layer is from 20 nm to 350 nm, and a thickness of the second protective layer is from 20 nm to 350 nm.

5. The thin-film device as claimed in claim 1, wherein a ratio of a thickness of the first protective layer to that of the second protective layer is from 0.1 to 5.

6. The thin-film device as claimed in claim 1, further comprising a second stacking structure overlaid on the flexible substrate, and the second stacking structure comprises:
   a third protective layer; and
   a fourth protective layer in contact with the third protective layer, wherein a refractive index of the third protective layer is different from a refractive index of the fourth protective layer.

7. The thin-film device as claimed in claim 6, further comprising an electronic device overlaid on the second stacking structure.

8. The thin-film device as claimed in claim 6, wherein the second stacking structure further comprises a sixth protective layer, wherein the third protective layer is overlaid on the flexible substrate, the fourth protective layer is overlaid on the third protective layer, the sixth protective layer is overlaid on the fourth protective layer, and a refractive index of the sixth protective layer is different from the refractive index of the fourth protective layer.

9. The thin-film device as claimed in claim 6, wherein the refractive index, material, and a thickness of the first protective layer and of the third protective layer are the same, and the refractive index, material, and a thickness of the second protective layer and of the fourth protective layer are the same.

10. A thin-film device, comprising:
a carrier;
a release layer overlaid on the carrier;
a plurality of first stacking structures overlaid on each other and overlaid on the release layer, and each of the first stacking structures comprising:
a first protective layer;
a second protective layer in contact with the first protective layer, wherein a refractive index of the first protective layer is greater than a refractive index of the second protective layer; and
a fifth protective layer, in contact with the second protective layer, wherein a refractive index of the fifth protective layer is greater than the refractive index of the second protective layer; and
a flexible substrate overlaid on the first stacking structures, wherein the first protective layers and the second protective layer are alternately overlaid on each other, one of the first protective layers is overlaid on and in contact with the release layer, one of the second protective layers is overlaid on and in contact with the one of the first protective layers, one of the fifth protective layers is overlaid on and in contact with the one of the second protective layers, and an absolute value of the refractive index of the first protective layer minus a refractive index of the release layer is greater than an absolute value of the refractive index of the second protective layer minus the refractive index of the release layer, wherein a reflectivity of the first stacking structure to a light beam passing there through is at least 50%.

11. The thin-film device as claimed in claim 10, comprising only two first stacking structures.

12. The thin-film device as claimed in claim 10, wherein a ratio of the refractive index of the first protective layer to the refractive index of the second protective layer is greater than 1.05.

13. The thin-film device as claimed in claim 10, wherein the first protective layer comprises silicon nitride, silicon oxide, titanium oxide, niobium oxide, or a combination thereof, and the second protective layer comprises silicon nitride, silicon oxide, titanium oxide, niobium oxide, or a combination thereof.

14. The thin-film device as claimed in claim 10, wherein a thickness of the first protective layer is from 20 nm to 350 nm and a thickness of the second protective layer is from 20 nm to 350 nm.

15. The thin-film device as claimed in claim 10, wherein a ratio of a thickness of the first protective layer to that of the second protective layer is from 0.1 to 5.

16. The thin-film device as claimed in claim 10, wherein one of the fifth protective layers is in contact with the flexible substrate, and the first protective layers, the second protective layers, and the fifth protective layers are alternately overlaid on each other.

17. The thin-film device as claimed in claim 10, further comprising a plurality of second stacking structures, alternately overlaid on each other, overlaid on the flexible substrate, and each of the second stacking structures comprising:
a third protective layer; and
a fourth protective layer in contact with the third protective layer, wherein a refractive index of the third protective layer is different from a refractive index of the fourth protective layer;
wherein the third protective layers and the fourth protective layers are alternately overlaid on each other.

18. The thin-film device as claimed in claim 17, further comprising an electronic device overlaid on the second stacking structures.

19. The thin-film device as claimed in claim 18, wherein the second stacking structure further comprises a sixth protective layer, wherein one of the third protective layers is in contact with the flexible substrate, one of the sixth protective layers is in contact with the electronic device, and the refractive index of the sixth protective layer and that of the fourth protective layer are different, wherein the third protective layers, the fourth protective layers, and the sixth protective layer are alternately overlaid on each other.

20. The thin-film device as claimed in claim 17, wherein the refractive index, material, and a thickness of the first protective layer and of the third protective layer are the same, and the refractive index, material, and a thickness of the second protective layer and of the fourth protective layer are the same.

21. A thin-film device, comprising:
a carrier;
a release layer overlaid on the carrier;
a first stacking structure, overlaid on the release layer, comprising:
a first protective layer;
a second protective layer, overlaid on and in contact with the first protective layer; and
a fifth protective layer, overlaid on and in contact with the second protective layer, wherein a refractive index of the first protective layer is greater than a refractive index of the second protective, and a refractive index of the fifth protective layer is greater than the refractive index of the second protective layer, wherein a thickness of the first protective layer is from 20 nm to 350 nm, and a thickness of the second protective layer is from 20 nm to 350 nm, wherein a ratio of a thickness of the first protective layer to that of the second protective layer is from 0.1 to 5; and
a flexible substrate overlaid on the first stacking structure, wherein the first stacking structure is between the release layer and the flexible substrate, and a reflectivity of the first stacking structure to a light beam passing there through is at least 50%.

* * * * *